United States Patent
Mukai et al.

(10) Patent No.: US 9,219,488 B2
(45) Date of Patent: Dec. 22, 2015

(54) AD CONVERSION CIRCUIT

(71) Applicant: Rohm Co., Ltd., Kyoto (JP)

(72) Inventors: Toru Mukai, Kyoto (JP); Tomohiro Nishimura, Kyoto (JP); Shinya Masuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/589,039

(22) Filed: Jan. 5, 2015

(65) Prior Publication Data

US 2015/0194974 A1 Jul. 9, 2015

(30) Foreign Application Priority Data

Jan. 7, 2014 (JP) .................. 2014-001012

(51) Int. Cl.
*H03M 1/66* (2006.01)
*H03M 1/06* (2006.01)
*H03M 1/18* (2006.01)
*H04B 3/54* (2006.01)

(52) U.S. Cl.
CPC .............. *H03M 1/0629* (2013.01); *H03M 1/18* (2013.01); *H04B 3/54* (2013.01)

(58) Field of Classification Search
CPC ....... H03M 3/00; H03M 3/344; H03M 3/324; H03M 3/439; H03M 2201/11; H03M 1/00; H03M 1/001; H03M 1/005; H03M 1/004; H03M 1/0602; H03M 1/0604; H03M 1/0607; H03M 1/0626; H03M 1/0629; H03M 1/0631; H03M 1/12; H03M 1/18

See application file for complete search history.

(56) References Cited

U.S. PATENT DOCUMENTS

| | | | | |
|---|---|---|---|---|
| 6,061,551 | A * | 5/2000 | Sorrells et al. | 455/118 |
| 6,078,462 | A * | 6/2000 | Zuffada et al. | 360/77.08 |
| 2004/0247022 | A1* | 12/2004 | Raghavan et al. | 375/219 |
| 2005/0147192 | A1* | 7/2005 | Yamamoto et al. | 375/345 |
| 2007/0291880 | A1* | 12/2007 | Ashkenazi | 375/345 |
| 2009/0065696 | A1* | 3/2009 | Mann et al. | 250/339.06 |
| 2010/0232547 | A1* | 9/2010 | Grosskinsky et al. | 375/320 |
| 2011/0013728 | A1* | 1/2011 | Husth | 375/317 |
| 2012/0033766 | A1* | 2/2012 | Hosokawa et al. | 375/340 |

FOREIGN PATENT DOCUMENTS

JP 2013-118495 6/2013

* cited by examiner

*Primary Examiner* — Siu Lee
(74) *Attorney, Agent, or Firm* — Fish & Richardson P.C.

(57) ABSTRACT

An analog-to-digital (AD) conversion circuit includes an analog filter configured to remove a high frequency component of an analog signal to generate a first signal, an AD converter (ADC) configured to AD-convert the first signal to generate a second signal, and a digital filter configured to remove a high frequency component of the second signal to generate a digital signal.

6 Claims, 7 Drawing Sheets

AD CONVERSION CIRCUIT

CROSS-REFERENCE TO RELATED APPLICATION

This application is based upon and claims the benefit of priority from Japanese Patent Application No. 2014-001012, filed on Jan. 7, 2014, the entire contents of which are incorporated herein by reference.

TECHNICAL FIELD

The present disclosure relates to an analog-to-digital (AD) conversion circuit.

BACKGROUND

FIG. 7 is a block diagram illustrating a conventional example of an AD conversion circuit. In such a conventional circuit, an AD conversion circuit X for converting an analog signal SA into a digital signal SD may be required in a front stage of a digital signal processor (DSP) 301 so that the analog signal SA is processed by the DSP 301.

The AD conversion circuit X according to the conventional example includes an AD converter (ADC) 302 with sampling frequency fs, a programmable gain amplifier (PGA) 303, and an analog filer (AFLT) 304. In the AD conversion circuit X, the analog filter 304 (also referred to as an antialiasing filter) is disposed in a front stage of the ADC 302 in order to prevent generation of aliasing (or folding noise) therefrom.

FIG. 8 is a view illustrating analog filter characteristics (or frequency-gain characteristics) according to a conventional example. As illustrated in FIG. 8, the analog filter 304 is a type of a low pass filter for removing a frequency component higher than a maximum frequency fh of an analog signal band.

In order to prevent generation of aliasing in the entire analog signal band, a condition of fh<fs/2l (=Nyquist frequency fn) needs to be met according to sampling theorem. Thus, the conventional AD conversion circuit X is configured such that an unnecessary high frequency component (>fh) is removed as much as possible from the analog signal SA by using the higher order (e.g., ninth order) analog filter 304 and the ADC 302 (e.g., fs=62.5 Msps with respect to fh=30 MHz) having a sampling frequency fs twice or greater than a maximum frequency fh of an analog signal band is used.

However, in the conventional AD conversion circuit X, the higher order analog filter 304 may be provided as an external component (passive element such as an inductor L, or a capacitor C) in order to reduce a circuit area and the power consumption, or the like of a semiconductor device 300. Thus, the conventional AD conversion circuit X may be problematic in that the number of external components and manufacturing cost increase.

SUMMARY

The present disclosure provides some embodiments of an AD conversion circuit adaptable for integration into a semiconductor device.

According to one embodiment of the present disclosure, provided is an analog-to-digital (AD) conversion circuit, including: an analog filter configured to remove a high frequency component of an analog signal to generate a first signal; an AD converter (ADC) configured to AD-convert the first signal to generate a second signal; and a digital filter configured to remove a high frequency component of the second signal to generate a digital signal (first configuration).

Further, in the AD conversion circuit having the first configuration, an order of the analog filter is lower than an order of a virtual filter formed by combining the analog filter, the ADC and the digital filter (second configuration).

Also, in the AD conversion circuit having the second configuration, a sampling frequency of the ADC is set to a value at which aliasing generated when the first signal is AD-converted does not affect characteristics of the AD conversion circuit (third configuration).

Also, in the AD conversion circuit having the third configuration, the sampling frequency of the ADC is set to four times or greater than a maximum frequency of the analog signal (fourth configuration).

Also, the AD conversion circuit having any one of the first to fourth configurations further includes a programmable gain amplifier (PGA) configured to adapt an amplitude of the analog signal to an input dynamic range of the ADC (fifth configuration).

Also, the AD conversion circuit having any one of the first to fifth configurations further includes a phase-locked loop (PLL) unit configured to generate a sampling clock signal of the ADC based on a master clock signal (sixth configuration).

Also, the AD conversion circuit having the sixth configuration further includes a filter adjusting unit configured to adjust a cutoff frequency of the analog filter based on the master clock signal (seventh configuration).

Also, in the AD conversion circuit having the seventh configuration, the analog filter is configured as a gm-C filter including a gm amplifier and a capacitor, and the filter adjusting unit is configured to variably control a bias voltage of the gm amplifiers based on the master clock signal (eighth configuration).

According to another embodiment of the present disclosure, provided is a semiconductor device, including: the AD conversion circuit having any one of the first to eighth configurations, configured to convert an analog signal into a digital signal; and a digital signal processing circuit configured to process the digital signal, wherein the AD conversion circuit and the digital signal processing circuit are integrated in the semiconductor device (ninth configuration).

According to another embodiment of the present disclosure, provided is a power line communication device, including: the semiconductor device having the ninth configuration; and a transformer configured to insulate the semiconductor device from a power line and transfer an analog signal (tenth configuration).

DETAILED DESCRIPTION

An embodiment of the present disclosure will now be described in detail with reference to the drawings.

<Premises LAN System>

Figure 1:
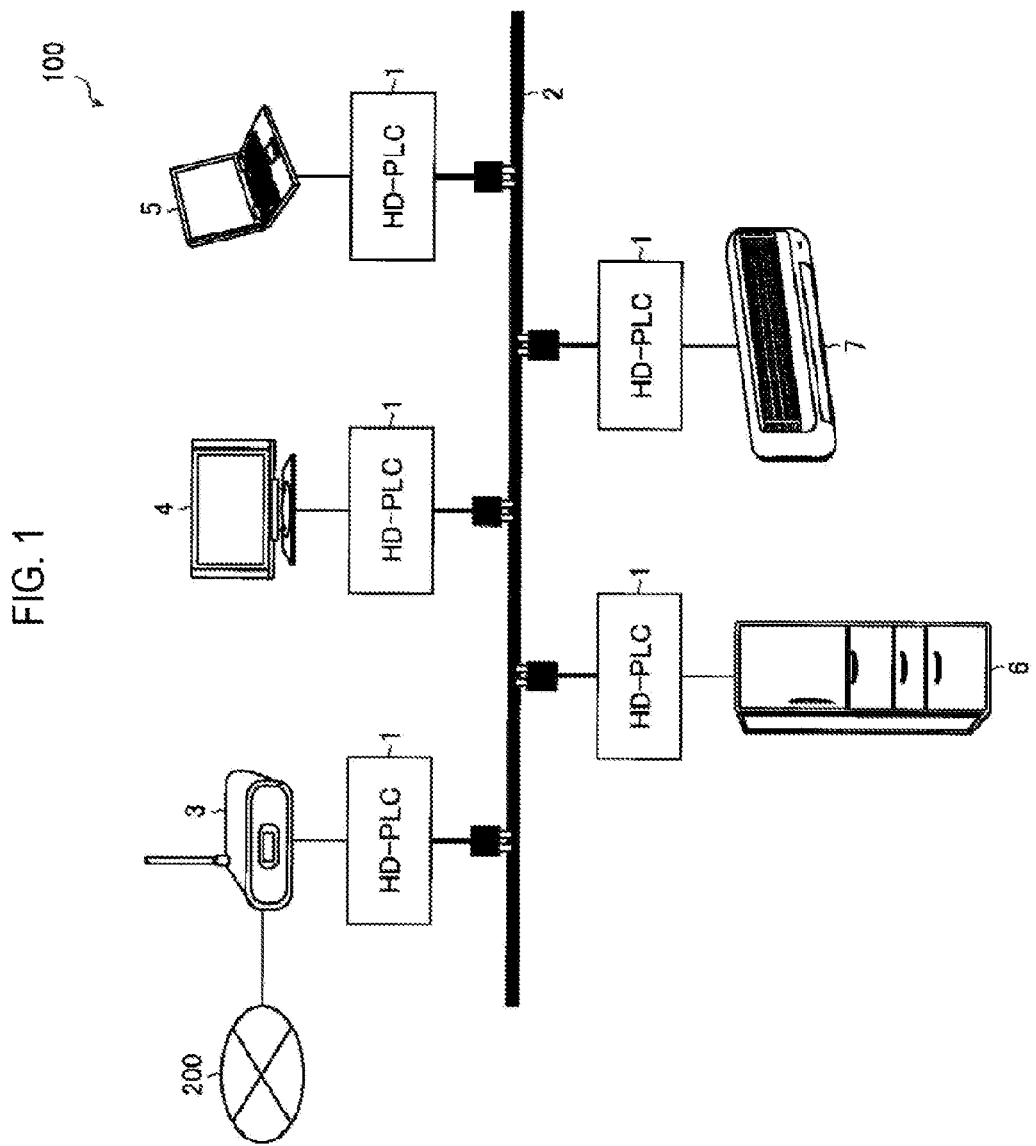
FIG. 1 is a view illustrating a premises LAN system according to an embodiment.

FIG. 1 is a view illustrating a premises local area network (LAN) system according to an embodiment. The premises LAN system 100 according to this embodiment includes a plurality of high definition-power line communication (HD-PLC) adapters 1, a power line 2, a router 3, a television (TV) 4, a personal computer (PC) 5, a refrigerator 6, and an air-conditioner 7.

The plurality of HD-PLC adapters 1 may be any type of PLC devices (e.g., modems having a bridge function) for modulating an information signal (e.g., image signal, voice signal, etc.) with a wavelet-orthogonal frequency-division multiplexing (OFDM) scheme and superposing the modulated signal onto the power line 2 to allow two-way communication between terminals connected thereto. For example, when accessing the Internet 200 (e.g., website search, etc.) using the PC 5, two-way communication is performed via the power line 2 between the HD-PLC adapter 1 (e.g., a parent device) connected to the router 3 and the HD-PLC adapter 1 (e.g., a child device) connected to the PC 5.

In this manner, the power line 2 pre-established in the premises may be used as a communication line in the premises LAN system 100 using the HD-PLC adapters 1. Further, when the HD-PLC adapters 1 are configured as multiport type adapters, a plurality of terminals may be connected to a single HD-PLC adapter 1. Also, the types of terminals that establish the premises LAN system 100 are not limited to this embodiment (i.e., the router 3, the TV 4, the PC 5, the refrigerator 6, and the air-conditioner 7), but various terminals may be connected.

<HD-PLC Adapter>

Figure 2:
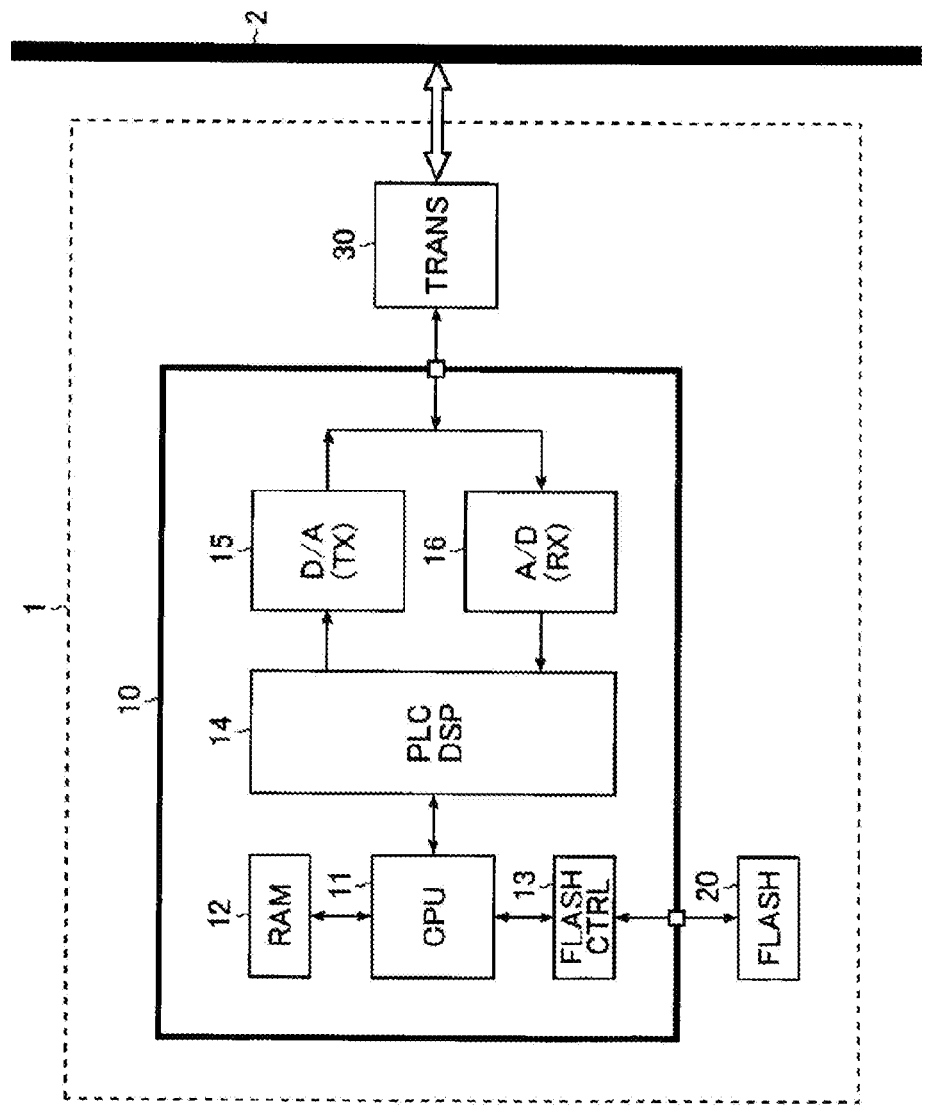
FIG. 2 is a block diagram illustrating an HD-PLC adapter according to an embodiment.

FIG. 2 is a block diagram illustrating the HD-PLC adapter 1 according to an embodiment. The HD-PLC adapter 1 according to this embodiment includes a semiconductor device 10, a flash memory 20, and a transformer 30. Also, power is supplied from the power line 2 to the HD-PLC adapter 1.

The semiconductor device 10 may be a controller IC for controlling the power line communication through the transformer 30. The semiconductor device 10 includes a central processing unit (CPU) 11, a random access memory (RAM) 12, a flash controller 13, a PLC digital signal processor (DSP) 14, and a digital-to-analog (DA) conversion circuit 15, and an analog-to-digital (AD) conversion circuit 16, which are integrated therein.

The CPU 11 is configured to control operations of the semiconductor device 10. For example, the CPU 11 may control communication with a terminal (not shown) connected to the HD-PLC adapter 1, and the like, in addition to controlling operations of the PLC DSP 14 and the flash controller 13.

The RAM 12 is a volatile semiconductor memory used as an operation region of the CPU 11 and a temporary storage region of various data.

The flash controller 13 is a memory control circuit for controlling an access to the flash memory 20 in response to an instruction from the CPU 11.

The PLC DSP 14 is a digital signal processing circuit for processing a digital signal in response to an instruction from the CPU 11.

The DA conversion circuit 15 is a circuit block for converting a digital signal input from the PLC DSP 14 into an analog signal and outputting the converted analog signal to the transformer 30. The DA conversion circuit 15 may serve as a transmission circuit TX of the HD-PLC adapter 1.

The AD conversion circuit 16 is a circuit block for converting an analog signal input from the transformer 30 into a digital signal and outputting the converted digital signal to the PLC DSP 14. The AD conversion circuit 16 may serve as a reception circuit RX of the HD-PLC adapter 1.

The flash memory 20 is a non-volatile semiconductor memory for storing firmware, and the like of the HD-PLC adapter 1. As the flash memory 20, a serial flash memory employing a serial bus may be used.

The transformer 30 may insulate the semiconductor device 10 from the power line 2, and also transfer an analog signal. In addition, the transformer 30 may include a coupling capacitor for blocking an alternate current (AC) frequency component (50 Hz/60 Hz) of general-purpose power.

Also, the semiconductor device 10, the flash memory 20, and the transformer 30 described above may be mounted as a single communication module on the HD-PLC adapter 1.

<AD Conversion Circuit(First Embodiment)>

Figure 3:
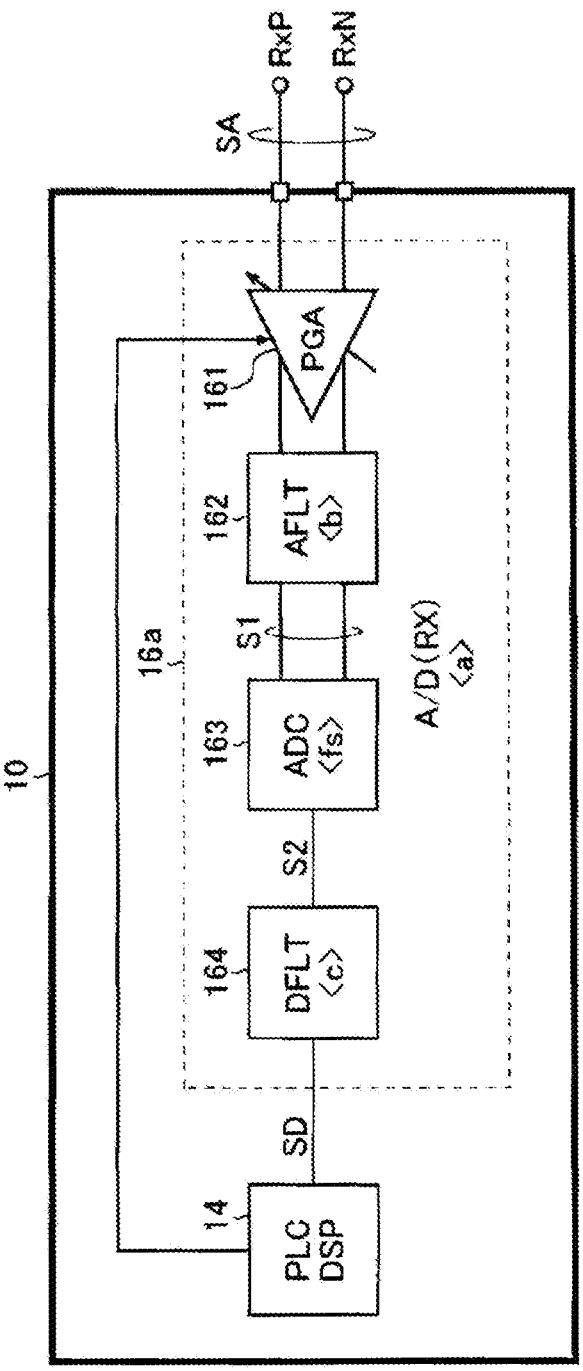
FIG. 3 is a block diagram illustrating a configuration of an AD conversion circuit according to a first embodiment.

FIG. 3 is a block diagram illustrating a configuration of an AD conversion circuit 16a according to a first embodiment. In this example, the AD conversion circuit 16a includes a programmable gain amplifier (PGA) 161, an analog filter (AFLT) 162, an ADC 163, and a digital filter (DFLT) 164.

The PGA 161 is configured to adapt an amplitude of an analog signal SA (in this embodiment, differential reception signals RxP and RxN) to an input dynamic range of the ADC 163. Also, a gain of the PGA 161 may be variably controlled by the PLC DSP 14.

The analog filter 162 may be an antialiasing filter for removing a high frequency component of the analog signal SA input through the PGA 161 to generate a first signal S1. Further, an order b (e.g., b=3) of the analog filter 162 is set to be lower than an order a (e.g., a>9) of a virtual filter formed by combining the analog filter 162, the ADC 163 and the digital filter 164. This will be described in detail later.

The ADC 163 may AD-convert the first signal Si and generate a second signal S2. A sampling frequency fs of the ADC 163 is set to a suitable value such that aliasing (or folding noise) generated when the first signal S1 is AD-converted does not affect the system (e.g., reception characteristics of the HD-PLC adapter 1, characteristics of the semiconductor device 10, characteristics of the AD conversion circuit 16a). This will be described in detail later.

The digital filter 164 may remove a high frequency component of the second signal S2 and generate a digital signal SD. An order c of the digital filter 164 may be appropriately set such that an order a of a virtual filter formed by combining the analog filter 162, the ADC 163, and the digital filter 164 has a desired value (e.g., 6<c<50 with respect to a>9).

Figure 4:
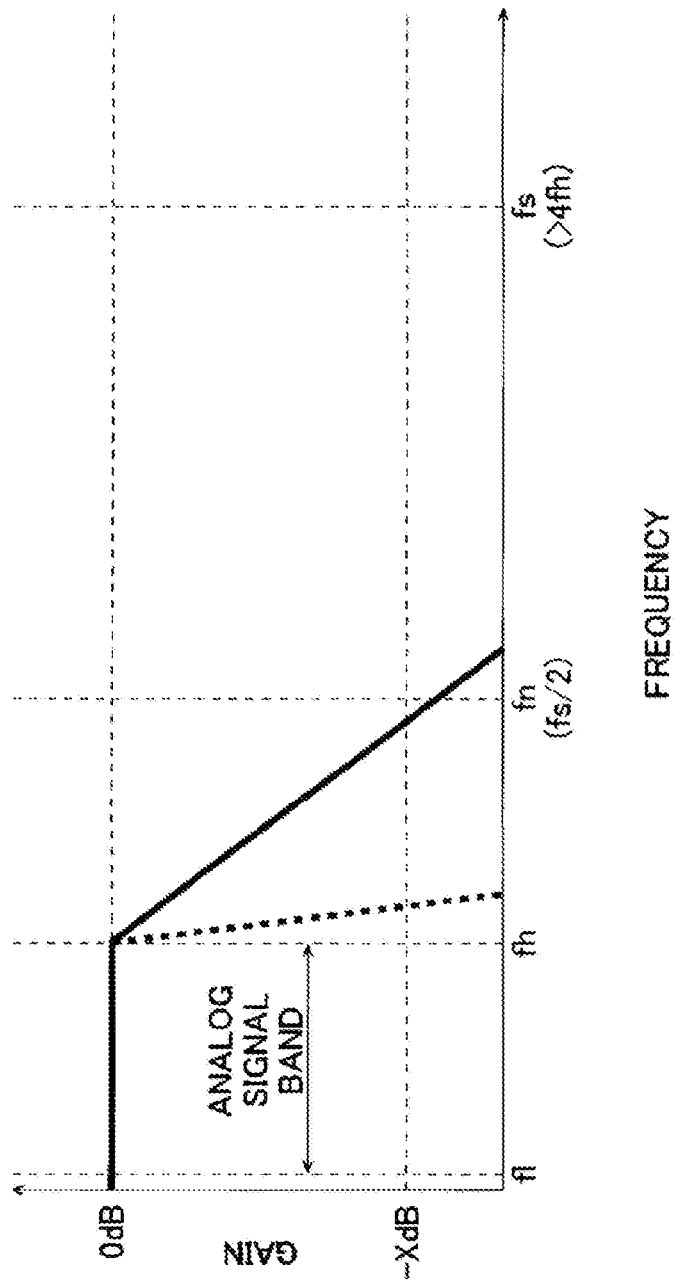
FIG. 4 is a view illustrating filter characteristics according to an embodiment.

FIG. 4 is a view illustrating an example of filter characteristics (frequency-gain characteristics) according to an embodiment. In FIG. 4, the solid line denotes filter characteristics of the analog filter 162 and the broken line denotes filter characteristics of the digital filter 164.

The analog signal SA may have a frequency range (hereinafter, referred to as an "analog signal band") ranging from a minimum frequency f1 (e.g., 2 MHz) to a maximum frequency fh (e.g., 30 MHz). Based on this, the sampling frequency fs of the ADC 163 is set to four times or greater (e.g., fs=125 MHz) than the maximum frequency fh of the analog signal band, and the order b of the analog filter 162 is set to an order (e.g., b=3) in which aliasing is equal to or lower than a system required level (−XdB) at a Nyquist frequency fn (e.g., fn=fs/2=62.5 MHz). Although it is difficult to illustrate generally, the system required level (−XdB) may be appropriately set such that aliasing does not exceed tolerance of the system, in consideration of various factors such as a communication rate, attenuation of a transmission path, and the like. The order c of the digital filter 164 is set to an order (e.g., 6<c<50 with respect to a>9) so that the order a of the virtual filter formed by combining the analog filter 162, the ADC 163, and the digital filter 164 has a desired value, as described above.

Figure 7:
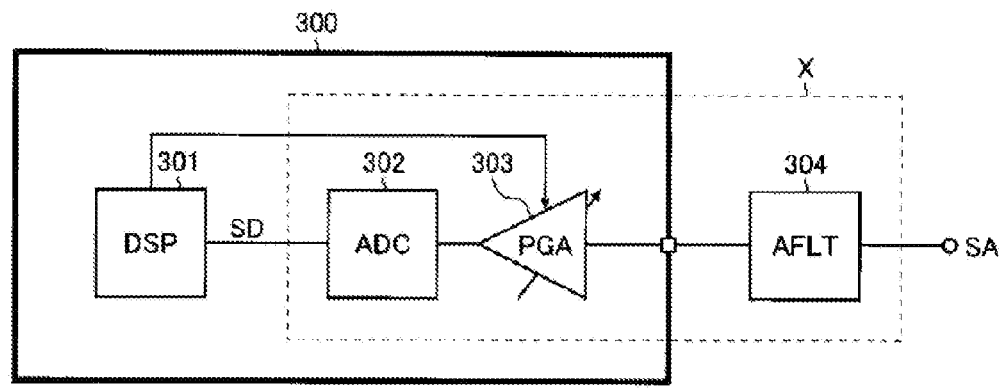
FIG. 7 is a block diagram illustrating a conventional example of an AD conversion circuit.
Figure 8:
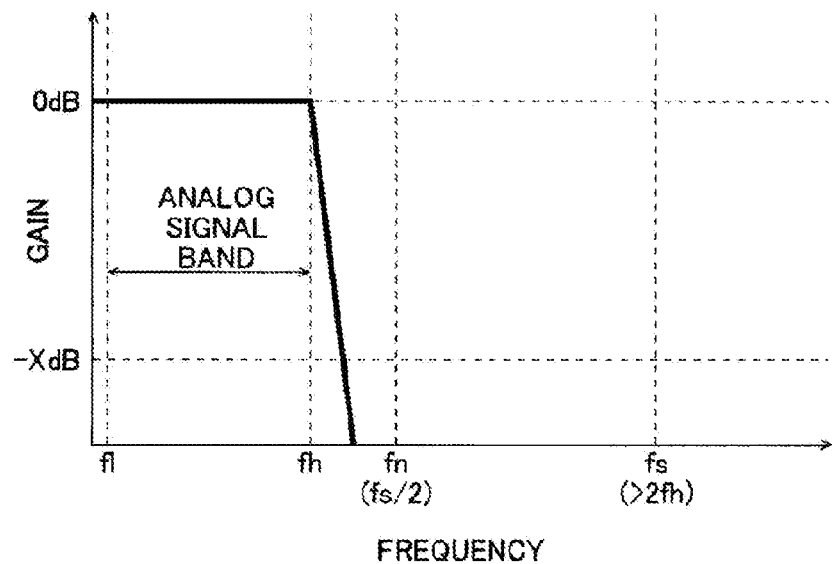
FIG. 8 is a view illustrating analog filter characteristics according to a conventional example.

In such a manner, compare to the conventional configuration (in which only the analog filter 304 removes all of the unnecessary high frequency component (>fh), see FIGS. 7 and 8), the AD conversion circuit 16a according to the first embodiment is configured to remove only a portion of the unnecessary high frequency component by using the analog filter 162 having an order lower than that of the conventional configuration. In addition, the AD conversion circuit 16a is configured to perform AD conversion by using the ADC 163 having the sampling frequency fs higher than that of the conventional configuration, and then remove a remaining unnecessary high frequency component by using the digital filter 164.

With such a configuration, even though the lower order analog filter 162 available for integration into the semiconductor device 10 is used, aliasing may be avoided in the ADC 163. Thus, manufacturing cost may be reduced, when compared with the conventional configuration in which antialiasing is performed by using only the higher order analog filter 304.

Further, in the AD conversion circuit 16a, the digital signal SD is generated through digital filtering by the digital filter 164 that may be relatively easily allowed to have a higher order. Thus, in terms of the entirety of the AD conversion circuit 16a, the AD conversion circuit 16a may have filter characteristics substantially equal to those of the conventional analog filter 304 (ninth order).

In addition, when the sampling frequency fs of the ADC 163 is increased, the Nyquist frequency fn is increased. In this case, since the order b of the analog filter 162 may be lowered, an additional reduction of a circuit area and power consumption of the analog filter 162 may be available. However, the power consumption of the ADC 163 itself may be increased as the sampling frequency fs of the ADC 163 is increased. Conversely, if a higher order (e.g., $4^{th}$ order) analog filter 162 may be integrated into the semiconductor device 10, it is possible to lower the sampling frequency fs of the ADC 163.

<AD Conversion Circuit(Second Embodiment)>

Figure 5:
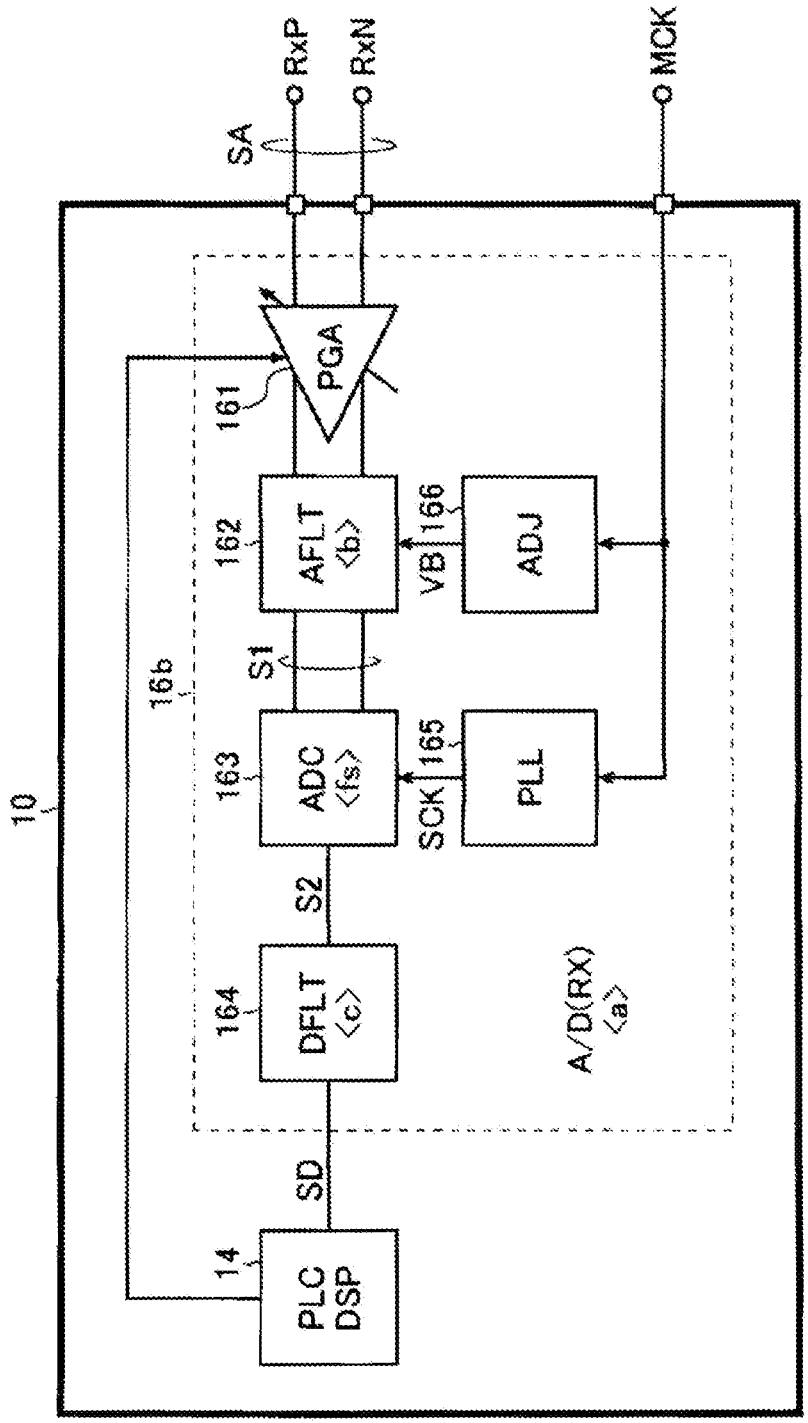
FIG. 5 is a block diagram illustrating configuration of an AD conversion circuit according to a second embodiment.

FIG. 5 is a block diagram illustrating configuration of an AD conversion circuit 16b according to a second embodiment. The AD conversion circuit 16b of the second embodiment basically has the same configuration as the AD conversion circuit 16a of the first embodiment, but, a phase-locked loop (PLL) unit 165 and a filter adjusting unit 166 are included in the AD conversion circuit 16b. Thus, the same reference numerals as those of FIG. 3 will be used for the same components as those of the first configuration, a repeated description will be omitted, and characteristic parts of the second embodiment will be described hereinafter in detail.

The PLL unit 165 is configured to generate a sampling clock signal SCK of the ADC 163 based on a master clock signal MCK input from the outside of the semiconductor device 10. The sampling frequency fs of the ADC 163 is determined by the sampling clock signal SCK. Thus, the AD conversion circuit 16b according to this embodiment may arbitrarily be set the sampling frequency fs of the ADC 163 by adjusting an oscillation frequency of the master clock signal MCK.

The filter adjusting unit 166 is configured to adjust a cutoff frequency of the analog filter 162 based on the oscillation frequency of the master clock signal MCK. Thus, the AD conversion circuit 16b according to this embodiment may optimize the cutoff frequency of the analog filter 162 in synchronization with an operation of setting the sampling frequency using the master clock signal MCK. In addition, the filter adjusting unit 166 is configured to adjust a bias voltage VB of the analog filter 162. This will be described in detail hereinafter.

<Analog Filter>

Figure 6:
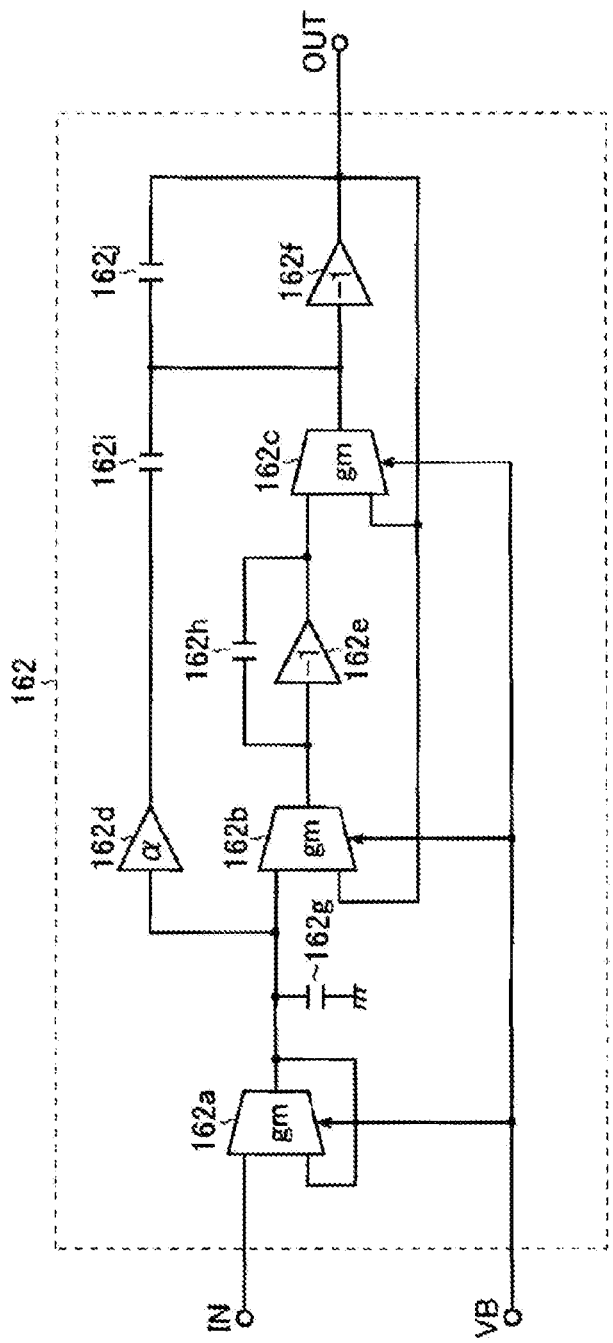
FIG. 6 is a circuit diagram illustrating an analog filter according to an embodiment.

FIG. 6 is a circuit diagram illustrating the analog filter 162 according to an embodiment. In this embodiment, a single end-type analog filter 162 will be described as an example for the convenience of description. The analog filter 162 according to this embodiment includes gm amplifiers 612a to 162c, an amplifier 162d, inverting amplifiers 162e and 162f, and capacitors 162g to 162j.

A first input terminal of the gm amplifier 162a is connected to a terminal to which an input signal IN (analog signal SA) is applied. A second input terminal of the gm amplifier 162a is connected to an output terminal of the gm amplifier 162a itself. The output terminal of the gm amplifier 162a is connected to each of a first input terminal of the gm amplifier 162b and an input terminal of the amplifier 162d. A second input terminal of the gm amplifier 162b is connected to a terminal to which an output signal OUT (i.e., the first signal S1) is applied. An output terminal of the gm amplifier 162b is connected to an input terminal of the inverting amplifier 162e. A first input terminal of the gm amplifier 162c is connected to an output terminal of the inverting amplifier 162e. A second input terminal of the gm amplifier 162c is connected to the terminal to which the output signal OUT is applied. An output terminal of the gm amplifier 162c is connected to an input terminal of the inverting amplifier 162f. An output terminal of the inverting amplifier 162f is connected to the terminal to which the output signal OUT is applied. The capacitor 162g is connected between the output terminal of the gm amplifier 162a and ground. The capacitor 162h is connected between the input terminal and the output terminal of the inverting amplifier 162e. The capacitor 162i is connected to an output terminal of the amplifier 162d and the output terminal of the gm amplifier 162c. The capacitor 162j is connected between the input terminal and the output terminal of the inverting amplifier 162f.

With such a configuration, the analog filter 162 may be configured as a gm-C filter including the gm amplifiers 162a to 162c and the capacitors 162g to 162j, and have cubic simultaneous chevyshev characteristics. The analog filter 162 of this embodiment may integrate all the circuit elements in the semiconductor device 10 without unnecessarily increasing a circuit area or power consumption.

Additionally, the bias voltage VB generated by the filter adjusting unit 166 is applied to the gm amplifiers 162a to 162c, and their respective output current characteristics may be determined by the bias voltage VB. Thus, the filter adjusting unit 166 may adjust the output current characteristics of the gm amplifiers 162a to 162c by variably controlling a voltage value of the bias voltage VB based on the oscillation frequency of the master clock signal MCK, which may result in adjusting the cutoff frequency of the analog filter 162 with ease.

<Other Modified Examples>

In the foregoing embodiment, the configuration in which the present disclosure is applied to the AD conversion circuit 16 serving as a reception circuit of the HD-PLC adapter 1 has been described as an example. However, the configuration of the present disclosure is not limited thereto but may be widely applied to any other AD conversion circuit provided for different purposes.

For example, the present disclosure can be applied to an HD-PLC adapter, or the like.

According to the present disclosure in some embodiments, it is possible to provide an AD conversion circuit adaptable for integration into a semiconductor device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An analog-to-digital (AD) conversion circuit, comprising:
    an analog filter configured to remove a high frequency component of an analog signal to generate a first signal;
    an AD converter (ADC) configured to AD-convert the first signal to generate a second signal; and
    a digital filter configured to remove a high frequency component of the second signal to generate a digital signal,
    wherein an order of the analog filter is lower than an order of a virtual filter formed by combining the analog filter, the ADC and the digital filter.

2. The AD conversion circuit of claim 1, wherein a sampling frequency of the ADC is set to a value at which aliasing generated when the first signal is AD-converted does not affect characteristics of the AD conversion circuit.

3. The AD conversion circuit of claim 2, wherein the sampling frequency of the ADC is set to four times or greater than a maximum frequency of the analog signal.

4. The AD conversion circuit of claim 1, further comprising:
    a programmable gain amplifier (PGA) configured to adapt an amplitude of the analog signal to an input dynamic range of the ADC.

5. The AD conversion circuit of claim 1, further comprising:
    phase-locked loop (PLL) unit configured to generate a sampling clock signal of the ADC based on a master clock signal.

6. A power line communication device, comprising:
    a semiconductor device; and
    a transformer configured to insulate the semiconductor device from a power line and transfer an analog signal,
    wherein the semiconductor device comprises:
        an analog-to-digital (AD) conversion circuit, configured to convert an analog signal into a digital signal; and
        a digital signal processing circuit configured to process the digital signal,
    wherein the AD conversion circuit comprises:
        an analog filter configured to remove a high frequency component of the analog signal to generate a first signal;
        an AD converter (ADC) configured to AD-convert the first signal to generate a second signal; and
        a digital filter configured to remove a high frequency component of the second signal to generate the digital signal, and
    wherein the AD conversion circuit and the digital signal processing circuit are integrated in the semiconductor device.

* * * * *